(12) United States Patent
Hu et al.

(10) Patent No.: US 9,748,383 B2
(45) Date of Patent: Aug. 29, 2017

(54) TRANSISTOR

(75) Inventors: Yong Hai Hu, Singapore (SG); Elizabeth Ching Tee Kho, Kuching (MY); Zheng Chao Liu, Shanghai (CN); Deb Kumar Pal, Kolkata (IN); Michael Mee Gouh Tiong, Kuching (MY); Jian Liu, Shanghai (CN); Kia Yaw Kee, Kuching (MY); William Lau, Kuching (MY)

(73) Assignee: X-FAB SEMICONDUCTOR FOUNDRIES AG, Erfurt (DE)

( * ) Notice: Subject to any disclaimer, the term of this patent is extended or adjusted under 35 U.S.C. 154(b) by 183 days.

(21) Appl. No.: 12/867,257

(22) PCT Filed: Feb. 12, 2009
(Under 37 CFR 1.47)

(86) PCT No.: PCT/EP2009/051660
§ 371 (c)(1),
(2), (4) Date: Feb. 1, 2011

(87) PCT Pub. No.: WO2009/101150
PCT Pub. Date: Aug. 20, 2009

(65) Prior Publication Data
US 2011/0198690 A1    Aug. 18, 2011

(30) Foreign Application Priority Data
Feb. 15, 2008  (MY) .................................. 20080284

(51) Int. Cl.
*H01L 29/78*   (2006.01)
*H01L 29/06*   (2006.01)
*H01L 29/423*  (2006.01)

(52) U.S. Cl.
CPC ...... *H01L 29/7834* (2013.01); *H01L 29/0653* (2013.01); *H01L 29/42368* (2013.01); *H01L 29/7835* (2013.01)

(58) Field of Classification Search
CPC .................................................... H01L 29/6659
(Continued)

(56) References Cited

U.S. PATENT DOCUMENTS 5,349,225 A * 9/1994 Redwine et al. ............. 257/336
5,362,982 A * 11/1994 Hirase et al. ................. 257/408
(Continued)

FOREIGN PATENT DOCUMENTS

JP           04018762         1/1992

OTHER PUBLICATIONS

PCT, International Search Report, International Application No. PCT/EP2009/051660; 2 pages (mailed Apr. 24, 2009; published Aug. 20, 2009).
(Continued)

*Primary Examiner* — Eugene Lee
(74) *Attorney, Agent, or Firm* — Thompson Hine LLP

(57) ABSTRACT

A Metal Oxide Semiconductor (MOS) transistor comprising: a source; a gate; and a drain, the source, gate and drain being located in or on a well structure of a first doping polarity located in or on a substrate; wherein at least one of the source and the drain comprises a first structure comprising: a first region forming a first drift region, the first region being of a second doping polarity opposite the first doping polarity; a second region of the second doping polarity in or on the first region, the second region being a well region and having a doping concentration which is higher than the doping concentration of the first region; and a third region of the second doping polarity in or on the second region. Due to the presence of the second region the transistor may have
(Continued)

a lower ON resistance when compared with a similar transistor which does not have the second region. The breakdown voltage may be influenced only to a small extent.

28 Claims, 5 Drawing Sheets

(58) Field of Classification Search
USPC .......................................................... 257/336
See application file for complete search history.

(56) References Cited

U.S. PATENT DOCUMENTS

| | | | | |
|---|---|---|---|---|
| 5,719,425 | A * | 2/1998 | Akram et al. ................ | 257/344 |
| 5,770,880 | A * | 6/1998 | Woodbury et al. ........... | 257/336 |
| 5,814,861 | A * | 9/1998 | Schunke ............. | H01L 29/7834 |
| | | | | 257/336 |
| 5,834,810 | A * | 11/1998 | Schunke et al. ............. | 257/336 |
| 5,998,274 | A * | 12/1999 | Akram ................ | H01L 29/6656 |
| | | | | 257/335 |
| 6,078,086 | A * | 6/2000 | Park .............................. | 257/386 |
| 6,211,552 | B1 | 4/2001 | Efland et al. | |
| 6,274,901 | B1 * | 8/2001 | Odake et al. ................. | 257/315 |
| 6,972,231 | B2 * | 12/2005 | Boden, Jr. ..................... | 438/268 |
| 6,989,567 | B2 * | 1/2006 | Tornblad et al. .............. | 257/343 |
| 7,087,973 | B2 * | 8/2006 | Mallikarjunaswamy | |
| | | | et al. ............................. | 257/493 |
| 7,145,203 | B2 * | 12/2006 | Wang ............................ | 257/339 |
| 7,157,779 | B2 * | 1/2007 | Nishibe et al. ............... | 257/408 |
| 7,348,248 | B2 * | 3/2008 | Cheng .......................... | 438/301 |
| 7,671,423 | B2 * | 3/2010 | Voldman ...................... | 257/369 |
| 2002/0125531 | A1 * | 9/2002 | Kikuchi et al. ............... | 257/344 |
| 2002/0153562 | A1 * | 10/2002 | Lee et al. ...................... | 257/344 |
| 2007/0057280 | A1 | 3/2007 | Hayashi et al. | |
| 2008/0023760 | A1 * | 1/2008 | Ito et al. ....................... | 257/335 |

OTHER PUBLICATIONS

PCT, International Preliminary Report on Patentability and Written Opinion; Patent Application No. PCT/EP2009/051660 (Aug. 26, 2010).

\* cited by examiner

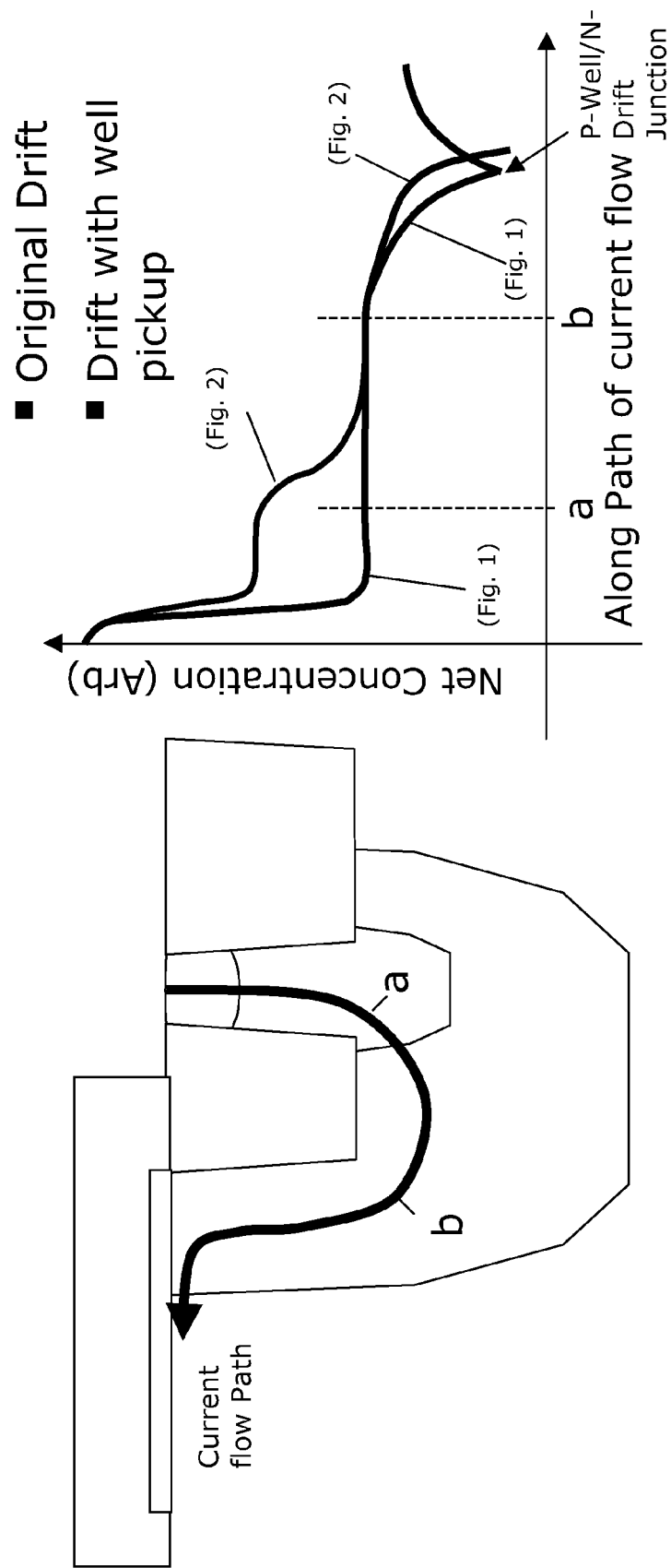

TRANSISTOR

This application is the national stage filing of PCT International Application No. PCT/EP2009/051660, which in turn claims priority to Malaysian Application No. PI20080284, filed on Feb. 15, 2008. The entire contents of both of these applications are incorporated herein by reference.

The present invention relates to a transistor. It finds particular application in power transistors and more particular in lateral diffused MOSFETs (LDMOST).

BACKGROUND

While principles and embodiments of the invention will be described with reference to a (high voltage) lateral diffused MOSFET, one skilled in the art will appreciate that the invention is also applicable to other transistors, and it will be clear to one skilled in the art, on considering the present specification, what details would need to be changed when applying the invention to such other transistors.

Integrated circuits in which a control function and a driver function are combined are usually referred to as smart power devices. Smart power devices combine high intelligence with low power dissipation. They typically have power Metal Oxide Semiconductor Field Effect Transistors (MOSFETs) in their output stages designed to operate at higher voltages (at least more than 15 volt) compared with the normal Complementary Metal Oxide Semiconductor (CMOS) logic voltage of typically 5 volts or less, and they typically have logic devices generally incorporated on the same integrated circuit so that both a driver function and a controller function are provided in a single chip. Smart power ICs find a lot of application, e.g. in liquid crystal displays, electro/mechanical devices, automobile electronic devices etc.

In order to increase the breakdown voltage in a high voltage MOSFET generally an $N^-$ drift region is formed in both the source and drain regions to result in a symmetric device, or only in the drain region to result in an asymmetric device. FIG. 1 illustrates a symmetrical LDMOS transistor, which includes a P-well region 10 and an $N^+$ drain region 12 formed in an $N^-$ drift region 16. An $N^+$ source region 11 is also formed in an $N^-$ drift region 15, both $N^-$ drift regions 15 and 16 being formed in the P-well. Current flows laterally from the source region 11 to the drain region 12 when an appropriate control voltage is applied to the gate to form a channel at the surface of the P-well region 10.

The P-well region 10 of the LDMOST is separated from the $N^+$ drain region 12 by an extended lightly doped region known as drift region 16. The source region 11 is similarly separated from P-well 10 by drift region 15. The drift region 16 supports the high voltage applied at the drain 12 in both the on and off state. The (near) vertical p-n junction 5 formed between P-well region 10 and $N^-$ drift region 16 causes avalanche breakdown to occur at the surface of the device. Generally, the breakdown voltage of such a device is less than that of a parallel plane p-n diode with similar doping concentration due to electric field crowding near the surface, even if an STI (shallow trench isolation) 17 of dielectric material is inserted in the $N^-$ drift region 16 to improve surface breakdown by increasing the length of the path between the drift surfaces and the $N^+$ drain 12. To address this situation the RESURF (Reduced Surface Field) concept has been applied. The concentration of the drift region is chosen according to the RESURF condition so that surface breakdown of such devices is eliminated by enhancing the depletion at the vertical junction 5 between the P-well 10 and the $N^-$ drift layer 16. The depletion layer of the parallel plane diode 6 is also increased so that the drift region is fully depleted before the surface electric field reaches a critical breakdown value. Device breakdown then occurs in the bulk at the parallel plane junction 6 formed between p-well 10 and $N^-$ drift layer 16. The depletion process is accomplished by controlling the amount of charge carriers in the drift region.

The present inventors have appreciated that the optimum breakdown voltage achieved with RESURF puts a limit on the upper bound of the doping concentration of the drift region and hence the minimum achievable specific ON resistance. According to the RESURF condition the $N^-$ drift concentration can be increased by decreasing the RESURF width (the width of the drift overlap channel active '$A_1$') to improve the ON resistance, but this will increase the substrate current during the ON state due to the high concentration of the drift region near the channel, which may worsen the Hot Current Injection (HCI) of the device.

SUMMARY

The present invention has been made to address the above problems. It is an object of at least preferred embodiments of the present invention to provide a transistor (preferably a high voltage lateral diffused metal oxide semiconductor transistor) with low ON resistance without (significantly) reducing the breakdown voltage. Accordingly, an extra layer of the same conducting type as the drift layer is incorporated between the drain and the drift layer, preferably also between the source and the drift layer. The doping concentration of the additional layer is higher but the depth is (much) less compared with the drift layer. The higher concentration may reduce the bulk resistance of the drift region, which may help to significantly reduce the ON resistance of the device. The lower depth may help not to influence much the doping profile of the parallel plane junction between the well and the drift so that no significant change is observed as regards junction breakdown, i.e. device breakdown. The HCI also is substantially not affected since there is substantially no change in drift concentration near the channel.

Aspects of the invention are set out in the independent claims.

BRIEF DESCRIPTION OF THE DRAWINGS

Some preferred embodiments of the invention will now be described by way of example only and with reference to the accompanying drawings, in which:

FIG. 3 shows a current flow path in the drain region.

FIG. 4 shows the concentration profiles of the drain region of the transistors of FIGS. 1 and 2.

DETAILED DESCRIPTION

Figure 2:
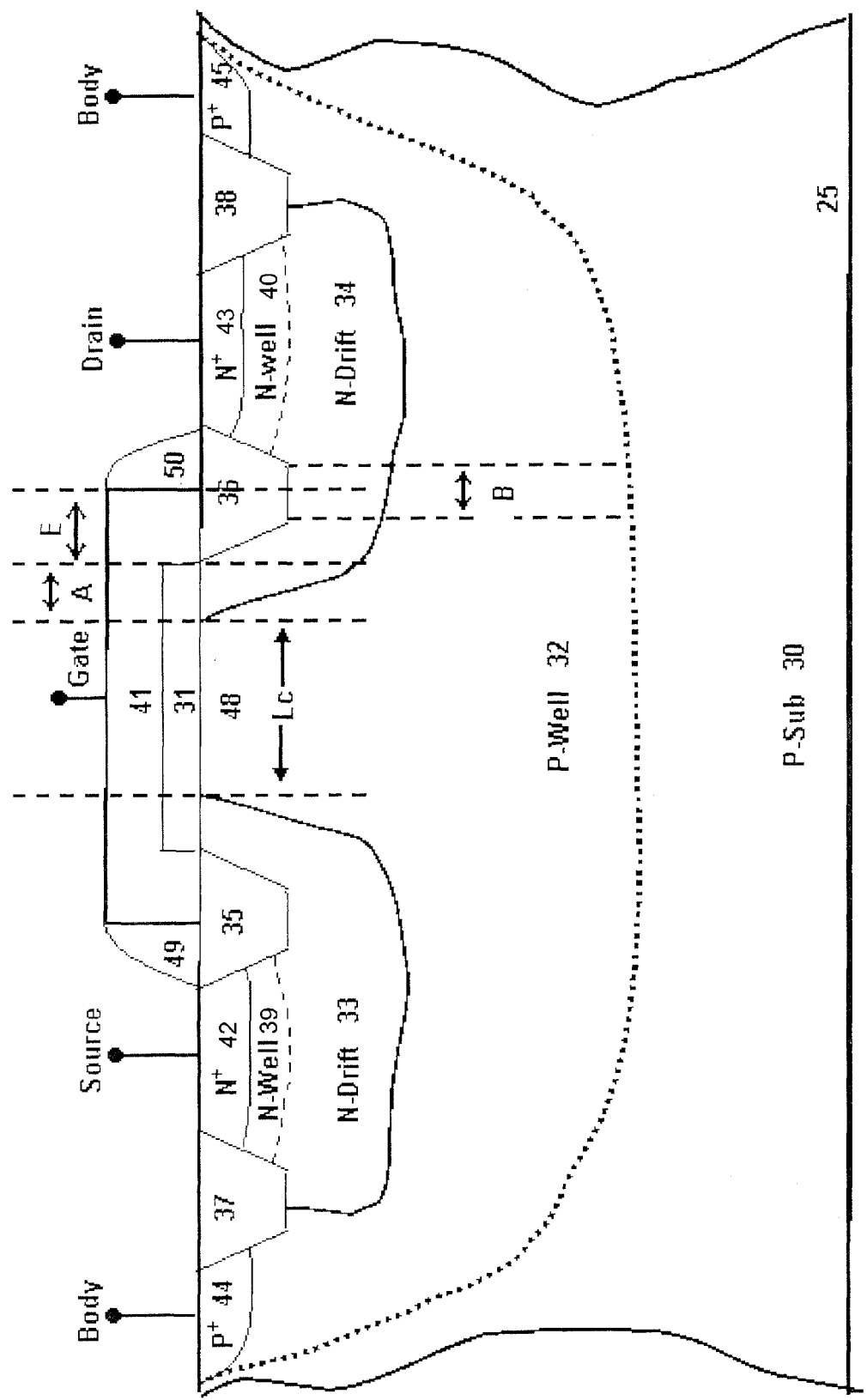
FIG. 2 is a cross sectional view of a symmetric lateral diffusion N-channel MOSFET according to an embodiment of the present invention.

FIG. 2 shows a cross sectional view of a high voltage LDMOS transistor 25 according to an embodiment of the present invention. LDMOS transistor 25 is formed on a P-substrate 30. A first P-well 32 is formed in substrate 30. Low doped N regions 33 and 34 are disposed in the P-well 32 and are used as drift regions. A first N-well region 39 is disposed in or on low doped N region 33 and a second N-well region 40 is disposed in or on low doped N region 34. This improves the bulk resistance of the drift region. A first $N^+$ doped region 42 is disposed in N-well 39. A source terminal is coupled to first $N^+$ doped region 42. $P^+$ doped regions 44 and 45 are disposed in P-well 32, towards the outer edge of P-well 32. Body terminals are coupled with the $P^+$ doped regions 44 and 45 respectively. A second $N^+$ region 43 is disposed in or on N-well 40. A drain terminal is coupled to the second $N^+$ region 43. Isolators 35 and 36 comprising a dielectric material such as silicon dioxide are deposited by conventional manner such as an STI process. Isolators 35 and 36 are located radially inwardly adjacent the N-well regions 39 and 40 and the $N^+$ doped regions 42 and 43, within drift regions 33 and 34. Isolators 37 and 38 such as trench isolators are disposed at least partially in N-drift regions 33 and 34 respectively and act so as to isolate $N^+$ regions 42 and 43 from $P^+$ regions 44 and 45 respectively. The isolators 37 and 38 comprise a dielectric material, preferably the same as isolators 35 and 36. A gate insulation layer 31 is grown over channel region 48. Gate insulation layer 31 also covers that portion of N-drift 33 and 34 which is located between isolators 35 and 36 and channel 48. A gate electrode 41 is in contact with the gate insulation layer 31 and the dielectric material of isolators 35 and 36. Insulating end caps 49 and 50 are also provided, over part of isolators 35 and 36, and laterally adjacent gate electrode 41, as is well known to those of ordinary skill in the art.

The region 'Lc' indicated in FIG. 2 corresponds to the channel of the device extending from the edge of the source drift to the edge of the drain drift. The region 'A' in FIG. 2 denotes the drift overlay channel active (drift extension under gate 31), region 'B' denotes the length of the STI field plate (isolator 36 length) and region 'E' indicates the gate electrode 41 extension to isolator 36.

Current flows from the source electrode to the drain electrode when an appropriate control signal is applied to the gate. The ON resistance of the device 25 is the sum of the channel resistance, bulk resistance of source and drain (mainly drift region) and the contact resistance of the electrode to source and drain. The main contributions generally come from the bulk resistance of the source and drain due to the presence of the low doped drift regions in the source and drain. The additional N-well layers 39 and 40 with a doping concentration one order higher than that of the N-drift 33 and 34 help to reduce the bulk resistance of the source and drain, which results in the reduction of the ON resistance of the device. On the other hand, the concentration of the N-drift 34 helps to substantially completely deplete the region 'A' according to the RESURF principle, and breakdown occurs in the bulk at the parallel plane junction 6 between P-well 32 and N-drift 34. The poly field plate 'E' region helps to reduce field crowding at the drain under the STI, which helps to increase the breakdown voltage.

A second embodiment (not specifically shown in the drawings) is substantially similar to the first embodiment. The second embodiment has the additional N-well 40 (as in FIG. 2) only on the drain side. However, the source side of the second embodiment is substantially similar to the source side of a conventional low voltage MOSFET structure. Hence, in the asymmetrical structure of the second embodiment the drain structure has the novel construction described above, but the source structure may be a conventional LDD (lightly doped drain) structure.

Figure 1:
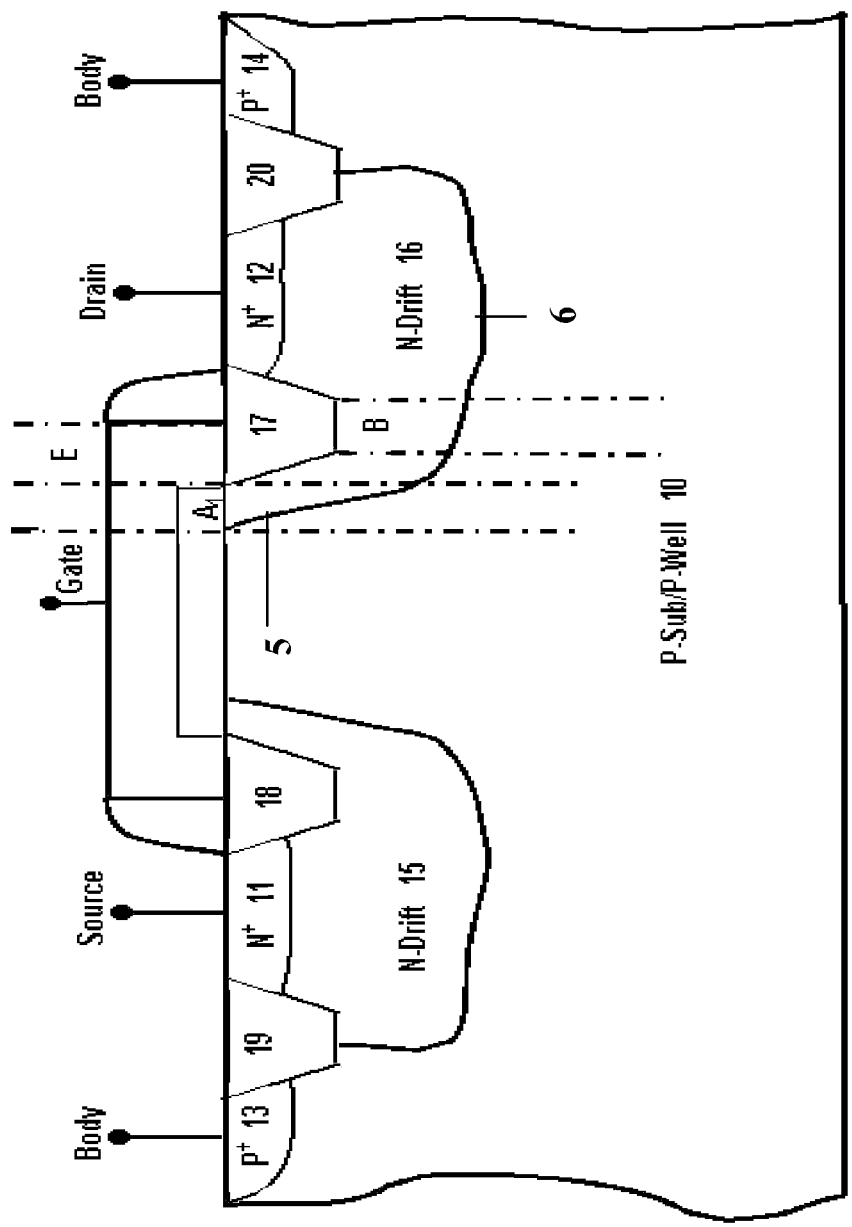
FIG. 1 is a cross sectional view of a prior art symmetric lateral diffusion N-channel MOSFET.

FIG. 3 shows the current flow path in the drain, and FIG. 4 shows the concentration profile along this current flow path. In FIG. 4, the curve which is generally lower than the other curve represents the concentration profile in a device according to FIG. 1 (prior art), whereas the other curve represents the concentration profile in a device according to FIG. 2. The N-well 40 (FIG. 2) is inserted in the drain with 70 Kev lower implant energy and lower drive in (but with an implant dose about one order higher) when compared with the N-drift 34 so the depth of the N-well 40 is much less than that of the N-drift 34. As a result, the P-well 32 and N-drift 34 junction profile (to the right of position "b" in FIG. 4) remains almost unaffected by the inclusion of the N-well 40. So the insertion of the N-wells 39, 40 changes the breakdown voltage only to a very small extent, whilst it reduces the ON resistance to a significant extent as indicated by the higher concentration around position "a" in FIG. 4).

Figure 5A:
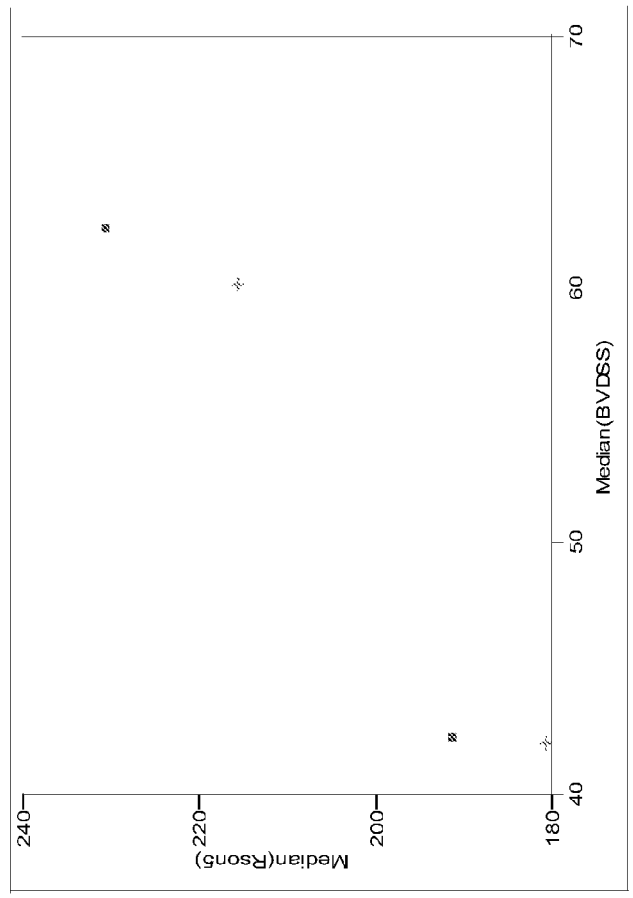
FIGS. 5a & 5b show characteristics of a device according to an embodiment of the present invention in comparison with a prior art transistor, respectively for a symmetric and an asymmetric case.
Figure 5B:
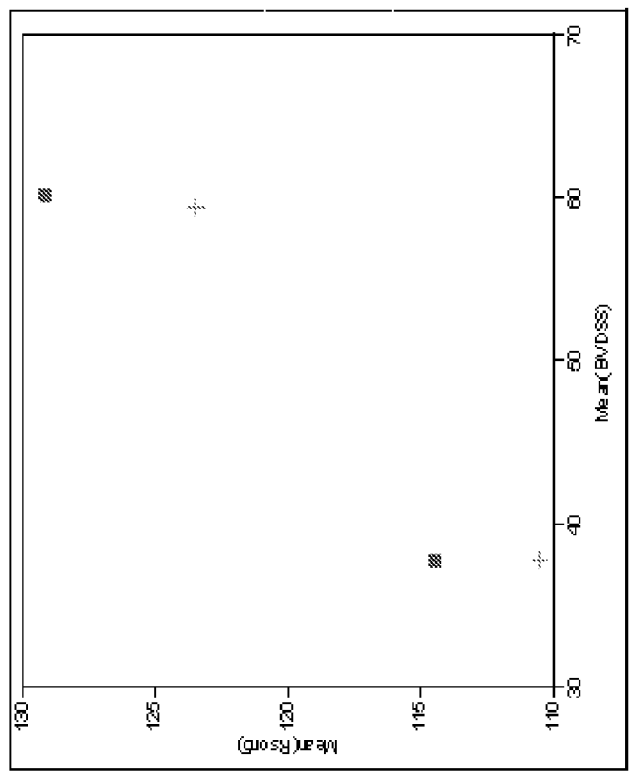

FIGS. 5a & 5b compare the characteristics of the resistance between the source and the drain $R_{on}sd$ and the breakdown voltage for different N-drift concentrations of the device. Characteristics of the prior art devices are indicated by small squares in FIGS. 5a and 5b, and characteristics of embodiments according to the present invention are indicated by small crosses. The devices according to embodiments of the present invention used for the purpose of FIG. 5a were symmetric ones, i.e. they had the additional N-well 39, 40 on both the source and the drain side. The devices of embodiments according to the present invention used for the purpose of FIG. 5b were asymmetric ones, i.e. they had the additional N-well 40 only on the drain side. As can be seen from FIGS. 5a and 5b, the additional N-well resulted in a significant reduction of the ON resistance $R_{on}sd$ without much affecting the breakdown voltage.

The N-drift concentration of devices according to the present invention is quite low near the channel so as to maintain the RESURF condition. This also helps to maintain better HCI performance of the device.

Figure 6:
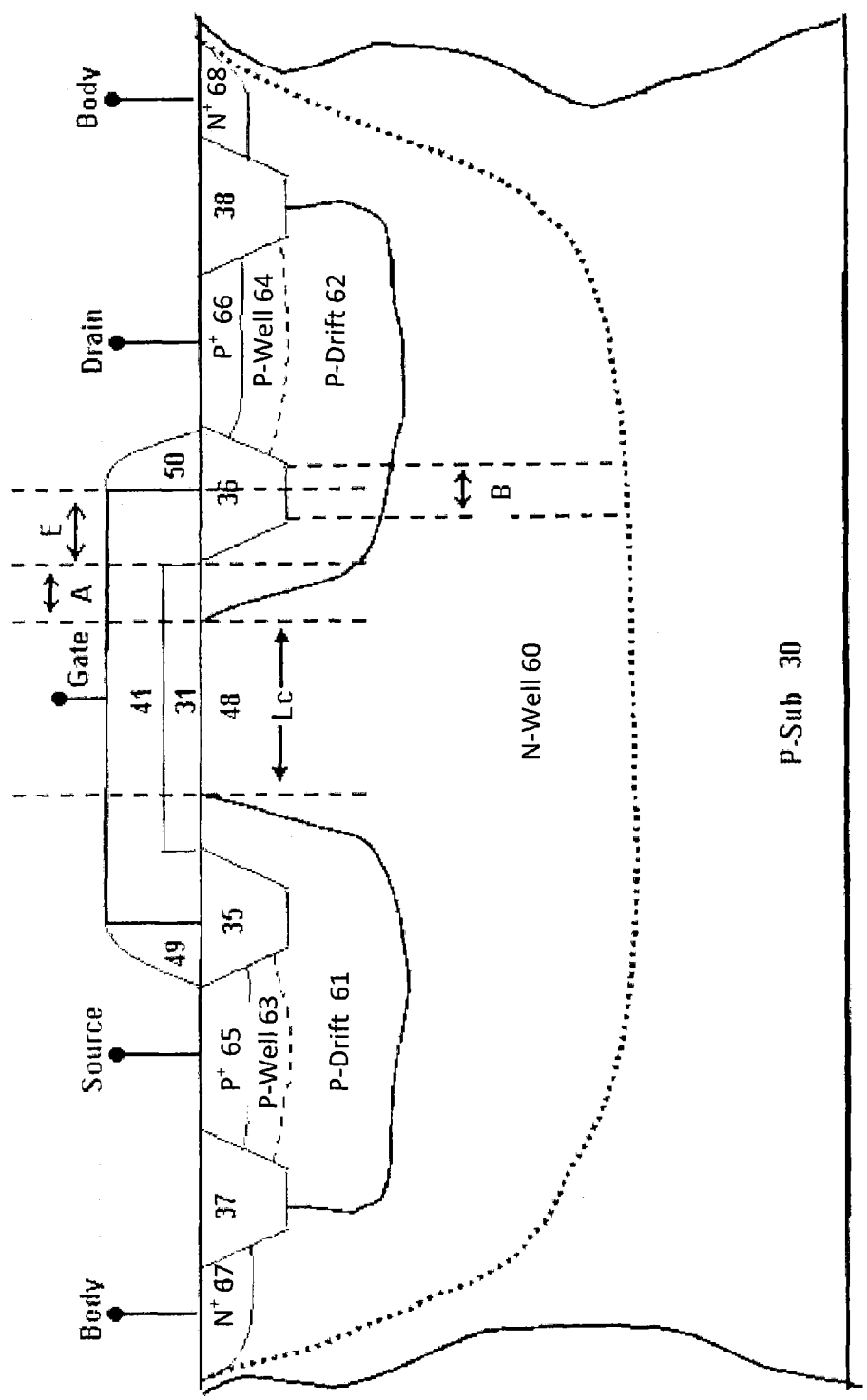
FIG. 6 shows a P-channel transistor.

FIG. 6 shows a cross sectional view of a high voltage pMOS transistor according to an embodiment of the present invention. The pMOS transistor has opposite doping polarities in most of the regions compared to the region of the LDMOS transistor of FIG. 2, except that the substrate region 30 in both transistors includes the same doping polarity; isolators 35, 36, 37 and 38, a gate electrode 41, a gate insulation layer 31 and insulating caps 49 and 50 are the same in both devices. Therefore these are referred to using the same reference numerals. The pMOS transistor is formed on the P-substrate 30. A first N-well 60 is formed in the substrate 30. Low doped P regions 61 and 62 are disposed in the N-well 60 and are used as drift regions. A first P-well region 63 is disposed in or on low doped P region 61 and a second P-well region 64 is disposed in or on low doped P region 62. This improves the bulk resistance of the drift region. A first $P^+$ doped region 65 is disposed in P-well 63. A source terminal is coupled to first $P^+$ doped region 65. $N^+$ doped regions 67 and 68 are disposed in N-well 60, towards the outer edge of N-well 60. Body terminals are coupled with the $N^+$ doped regions 67 and 68 respectively. A second $P^+$ region 66 is disposed in or on P-well 64. A drain terminal is coupled to the second $P^+$ region 66. Isolators 35 and 36 comprising a dielectric material such as silicon dioxide are deposited by conventional manner such as an STI process. Isolators 35 and 36 are the same as those used in the transistor of FIG. 2. Isolators 35 and 36 are located radially inwardly adjacent the P-well regions 63 and 64 and the $P^+$ doped regions 65 and 66, within drift regions 61 and 62. Isolators 37 and 38 such as trench isolators are disposed at least partially in P− drift regions 61 and 62 respectively and act so as to isolate P+ regions 65 and 66 from N' regions 67 and 68 respectively. The isolators 37 and 38 comprise a dielectric material, preferably the same as isolators 35 and 36. A gate insulation layer 31 is grown over channel region 48. Gate insulation layer 31 also covers that portion of P-drift 61 and 62 which is located between isolators 35 and 36 and channel 48. The gate electrode 41 is in contact with the gate insulation layer 31 and the dielectric material of isolators 35 and 36. Insulating end caps 49 and 50 are also provided, over part of isolators 35 and 36, and laterally adjacent gate electrode 41, as is well known to those of ordinary skill in the art.

Preferred embodiments of the present invention may have the advantage that the high voltage MOS device may be made smaller due to the lower specific ON resistance ($R_{on}sd$). This may advantageously permit more high voltage devices to be placed in a smaller area on an Integrated Circuit. Preferred embodiments of the present invention may have the further advantage that no additional mask is required for the additional step of providing the N-well(s) 39, 40, which means that the additional step can easily be incorporated in most standard fabrication processes of smart power devices.

Those of ordinary skill in the art will appreciate that the conductivity types may be exchanged (N for P and P for N) and the device built with an N-well as a P-channel MOSFET.

The invention can be advantageously applied to many types of high voltage NMOS and high voltage PMOS transistors used in smart power devices which are designed to operate with a drain to source voltage of 15 volts and above.

The present invention may be embodied using various topological shapes, such as a square or a rounded shape for example.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

What is claimed is:

1. A Metal Oxide Semiconductor (MOS) power transistor comprising:
   a source;
   a gate; and
   a drain,
   the source, gate and drain being located in or on a well structure of a first doping polarity located in or on a substrate;
   wherein each of the source and the drain is provided with a first structure comprising:
   a first region forming a first drift region, the first region being of a second doping polarity opposite the first doping polarity;
   a second region of the second doping polarity in the first region, the second region being a well region and having a doping concentration which is higher than the doping concentration of the first region;
   a third region of the second doping polarity in or on the second region, wherein the third region does not contact the first region and wherein the doping concentration of the first region is such that the first region is substantially fully depleted, and breakdown occurs at a junction between the first region and the well structure, the junction being substantially parallel to the surface of the device; and
   a pair of isolators disposed at least partially in the first drift region, wherein the third region is surrounded by the second region and the pair of isolators so that during operation of the transistor current flowing between the source and the drain must pass through the second region.

2. A transistor according to claim 1, wherein the doping concentration of the second region is between half an order and two orders higher than the doping concentration of the first region.

3. A transistor according to claim 1, wherein a source or drain terminal is respectively connected to the third region.

4. A transistor according to claim 1, wherein the thickness of the second region is less than the thickness of the first region.

5. A transistor according to claim 1, wherein the doping concentrations and thicknesses of the first, second and third regions are such that the ON resistance of the resistor is reduced when compared with a transistor of similar construction but without the second region.

6. A transistor according to claim 1, wherein the doping concentrations and thicknesses of the first, second and third regions are such that the breakdown voltage is not significantly reduced when compared with a transistor of similar construction but without the second region.

7. A transistor according to claim 1, wherein the doping concentration of the first region is between 1 E15 and 1 E17.

8. A transistor according to claim 1, wherein the doping concentration of the second region is between 1 E16 and 1 E18.

9. A transistor according to claim 1, wherein the thickness of the first region is between 1 μm and 3 μm.

10. A transistor according to claim 1, wherein the thickness of the second region is between 0.2 μm and 1 μm.

11. A transistor according to claim 1, wherein: the doping concentration of the third region is between about 2 and 4 orders higher than the doping concentration of the second region.

12. The transistor of claim 1, wherein the power transistor is configured to operate with a drain to source voltage of 15 volts and above.

13. The transistor of claim 1, wherein the transistor is a symmetrical transistor.

14. A transistor according to claim 1, wherein the transistor comprises insulating end caps, each insulating end cap being laterally adjacent the gate.

15. The transistor according to claim 1 and comprising a field plate laterally extending from the gate.

16. The transistor according to claim 15, wherein the field plate at least partially covers the first set of isolators.

17. The transistor according to claim 15, wherein the field plate is arranged to reduce field crowding at the drain.

18. A high voltage N-channel lateral diffused Metal Oxide Semiconductor (LDMOS) transistor comprising:
   a P-doped substrate;
   a P-well disposed in said substrate;
   a first N− doped region disposed in the P-well, the first N− doped region forming a first drift region;

a first N-well with a concentration one order higher than that of the first N⁻ doped region, the first N-well being disposed in the first N⁻ doped region;

a first N⁺ doped region disposed in said first N-well;

a source terminal coupled to said first N⁺ doped region;

a second N⁻ doped region disposed in the P-well, the second N⁻ doped region forming a second drift region;

a second N-well with a concentration one order higher than that of the second N⁻ doped region, the second N-well being disposed in the second N⁻ doped region;

a second N⁺ doped region disposed in said second N-well;

a drain terminal coupled to said second N⁺ doped region;

two P⁺ doped regions disposed in the P-well;

a body terminal coupled to said P⁺ doped regions;

a channel region in the body region between the edges of the source and drain drift regions;

a dielectric layer grown over the channel region and a portion of the first and second drift regions defining a drift overlay channel active of both the source and the drain;

a first pair of isolators disposed in said first and second drift regions respectively, said first pair of isolators comprising a dielectric material that is in contact with said dielectric layer;

a gate disposed over said dielectric layer and a portion of said first pair of isolators;

a second pair of isolators disposed at least partially in said first and second drift regions respectively, said second pair of isolators comprising a dielectric material and isolating said first N⁺ doped region and said second N⁺ doped region from said P⁺ doped regions respectively, wherein the first N+ doped region does not contact the first N– doped region and the second N+ doped region does not contact the second N– doped region, wherein the doping concentration of the first N⁻ doped region is such that the first N⁻ doped region is substantially fully depleted, and breakdown occurs at a junction between the first N⁻ doped region and the P-well, the junction being substantially parallel to the surface of the device, and wherein the doping concentration of the second N⁻ doped region is such that the second N⁻ doped region is substantially fully depleted, and breakdown occurs at a junction between the second N⁻ doped region and the P-well, the junction being substantially parallel to the surface of the device; and wherein the first N+ doped region is surrounded by the first N-well and the isolators disposed at least partially in the first drift region, and wherein the second N+ doped region is surrounded by the second N-well and the isolators disposed at least partially in the second drift region, so that during operation of the transistor current flowing between the source terminal and the drain terminal must pass through the first and second N-wells.

19. The transistor of claim 18, wherein the first N doped region is a LDD (lightly doped drain) region and wherein the channel region is between the edges of the source LDD and drain drift region, and wherein the dielectric layer is grown over the P-well and a portion of the N-drift and N-LDD regions.

20. The transistor of claim 18, wherein the transistor has at least one feature selected from the following list:
(a) said gate comprises N⁺ doped polysilicon,
(b) said dielectric material is silicon dioxide,
(c) said isolators are formed with a STI process,
(d) the MOSFET is fabricated using a process technology of 0.18 micrometer, and
(e) the N-wells are formed using a standard process.

21. The transistor of claim 20, wherein:
a length (A) of a region of lateral diffusion under the gate is greater than or equal to 0.2 micrometer;
a length (B) of a region coextensive with the isolators of the first pair of isolators and extending to an edge of the second N⁺ doped region is greater than or equal to 1.8 micrometer;
and a length (E) of a region extending from one end of the channel region to an end of the gate is greater than or equal to 0.8 micrometer.

22. The transistor of claim 18, wherein the transistor comprises insulating end caps, each insulating end cap being laterally adjacent the gate.

23. A high voltage P-channel lateral diffused Metal Oxide Semiconductor (LDMOS) transistor comprising:
a P-doped substrate;
an N-well disposed in said substrate;
a first P⁻ doped region disposed in the N-well, the first P⁻ doped region forming a first drift region;
a first P-well with a concentration one order higher than that of the first P⁻ doped region, the first P-well being disposed in the first P⁻ doped region;
a first P⁺ doped region disposed in said first P-well;
a source terminal coupled to said first P⁺ doped region;
a second P⁻ doped region disposed in the N-well, the second P⁻ doped region forming a second drift region;
a second P-well with a concentration one order higher than that of the second P⁻ doped region, the second P-well being disposed in the second P⁻ doped region;
a second P⁺ doped region disposed in said second P-well;
a drain terminal coupled to said second P⁺ doped region;
two N⁺ doped regions disposed in the N-well;
a body terminal coupled to said N⁺ doped regions;
a channel region in the body region between the edges of the source and drain drift regions;
a dielectric layer grown over the channel region and a portion of the first and second drift regions defining a drift overlay channel active of both the source and the drain;
a first pair of isolators disposed in said first and second drift regions respectively, said first pair of isolators comprising a dielectric material that is in contact with said dielectric layer;
a gate disposed over said dielectric layer and a portion of said first pair of isolators;
a second pair of isolators disposed at least partially in said first and second drift regions respectively, said second pair of isolators comprising a dielectric material and isolating said first P⁺ doped region and said second P⁺ doped region from said N⁺ doped regions respectively, wherein the first P+ doped region does not contact the first P– doped region and the second P+ doped region does not contact the second P– doped region, wherein the first P-well does not contact the gate insulation layer and wherein the second P-well does not contact the gate insulation layer; and wherein the first P+ doped region is surrounded by the first P-well and the isolators disposed at least partially in the first drift region, and wherein the second P+ doped region is surrounded by the second P-well and the isolators disposed at least partially in the second drift region, so that during operation of the transistor current flowing between the source terminal and the drain terminal must pass through the first and second P-wells.

24. The transistor of claim 23, wherein the first P⁻ doped region is a LDD (lightly doped drain) region and wherein the channel region is between the edges of the source LDD and the drain drift region, and wherein the dielectric layer is grown over said N-well and a portion of the P⁻ drift and P-LDD regions.

25. The transistor of claim 23, wherein the transistor has at least one feature selected from the following list:
 (a) said gate comprises P⁺ doped polysilicon,
 (b) said dielectric material is silicon dioxide,
 (c) said isolators are formed with a STI process,
 (d) the MOSFET is fabricated using a process technology of 0.18 micrometer, and
 (e) the P-wells are formed using a standard process.

26. The transistor of claim 25 wherein:
 a length (A) of a region of lateral diffusion under the gate is greater than or equal to 0.1 micrometer;
 a length (B) of a region coextensive with the isolators of the first pair of isolators and extending to an edge of the second P⁺ doped region is greater than or equal to 1.8 micrometer; and
 a length (E) of a region extending from one end of the channel region to an end of the gate is greater than or equal to 0.8 micrometer.

27. The transistor of claim 23, wherein the first P-well does not surround the first P⁺ doped region and the second P-well does not surround the second P⁺ doped region.

28. The transistor of claim 23, wherein the transistor comprises insulating end caps, each insulating end cap being laterally adjacent the gate.

\* \* \* \* \*